United States Patent
Iwabuchi et al.

(10) Patent No.: US 7,357,961 B2
(45) Date of Patent: Apr. 15, 2008

(54) COMPOSITION FOR FORMING POROUS FILM, POROUS FILM AND METHOD FOR FORMING THE SAME, INTERLEVEL INSULATOR FILM, AND SEMICONDUCTOR DEVICE

(75) Inventors: Motoaki Iwabuchi, Niigata-ken (JP); Fujio Yagihashi, Niigata-ken (JP); Yoshitaka Hamada, Niigata-ken (JP); Takeshi Asano, Niigata-ken (JP); Hideo Nakagawa, Oumihachiman (JP); Masaru Sasago, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/819,544

(22) Filed: Apr. 7, 2004

(65) Prior Publication Data

US 2004/0202874 A1    Oct. 14, 2004

(30) Foreign Application Priority Data

Apr. 9, 2003    (JP) .............................. 2003-104772

(51) Int. Cl.
*C08G 77/06* (2006.01)
*B05D 3/02* (2006.01)

(52) U.S. Cl. .................. 427/387; 427/373; 528/21
(58) Field of Classification Search ............... 428/447; 427/387; 106/287.1; 528/10–43
See application file for complete search history.

(56) References Cited

U.S. PATENT DOCUMENTS

| | | | |
|---|---|---|---|
| 4,634,509 A | 1/1987 | Shimizu et al. | |
| 5,494,859 A | 2/1996 | Kapoor | |
| 5,707,783 A | 1/1998 | Stauffer et al. | |
| 6,037,275 A | 3/2000 | Wu et al. | |
| 6,197,913 B1 | 3/2001 | Zhong | |
| 6,313,045 B1 | 11/2001 | Zhong et al. | |
| 6,359,096 B1 | 3/2002 | Zhong et al. | |
| 6,376,634 B1 | 4/2002 | Nishikawa et al. | |
| 6,391,999 B1 * | 5/2002 | Crivello | 528/12 |
| 6,413,647 B1 | 7/2002 | Hayashi et al. | |
| 6,495,264 B2 * | 12/2002 | Hayashi et al. | 428/447 |
| 6,512,071 B1 * | 1/2003 | Hacker et al. | 528/21 |
| 6,533,855 B1 | 3/2003 | Gaynor et al. | |
| 6,534,025 B1 | 3/2003 | Yano et al. | |
| 6,596,404 B1 | 7/2003 | Albaugh et al. | |
| 6,632,489 B1 | 10/2003 | Watanabe et al. | |
| 6,639,015 B1 | 10/2003 | Nakashima et al. | |
| 6,696,538 B2 * | 2/2004 | Ko et al. | 528/34 |
| 6,930,393 B2 * | 8/2005 | Hamada et al. | 257/758 |
| 7,081,272 B2 | 7/2006 | Sasaki et al. | |
| 2002/0020327 A1 | 2/2002 | Hayashi et al. | |
| 2002/0086167 A1 * | 7/2002 | Hayashi et al. | 428/447 |
| 2002/0098279 A1 | 7/2002 | Lyu et al. | |
| 2002/0155053 A1 | 10/2002 | Nishiyama et al. | |
| 2002/0160207 A1 | 10/2002 | Kohmura et al. | |
| 2003/0064321 A1 | 4/2003 | Malik et al. | |
| 2003/0091838 A1 * | 5/2003 | Hayashi et al. | 428/447 |
| 2003/0104225 A1 | 6/2003 | Shiota et al. | |
| 2003/0157311 A1 | 8/2003 | MacDougall et al. | |
| 2003/0191269 A1 | 10/2003 | Ko et al. | |
| 2004/0047988 A1 * | 3/2004 | Lee et al. | 427/240 |
| 2005/0260420 A1 * | 11/2005 | Collins et al. | 428/446 |

FOREIGN PATENT DOCUMENTS

| | | |
|---|---|---|
| EP | 1 205 438 A1 | 5/2002 |
| EP | 1223192 A1 | 7/2002 |
| EP | 1245642 A1 | 10/2002 |
| EP | 1 123 753 A2 | 8/2003 |
| JP | 63-015355 | 4/1988 |
| JP | 05-125191 | 5/1993 |
| JP | 06-145599 | 5/1994 |
| JP | 09-194298 | 7/1997 |
| JP | 11-246665 | 9/1999 |
| JP | 2000-44875 | 2/2000 |
| JP | 2000-309751 | 11/2000 |

(Continued)

OTHER PUBLICATIONS

Burkett et al., "Synthesis Of Hybrid Inorganic-Organic Mesoporous Silica by Co-Condensation Of Siloxane And Organosiloxane Precursors," *J. Chem. Soc. Chem. Commun.*, 1996, 1367-1368.

(Continued)

*Primary Examiner*—Marc S. Zimmer
(74) *Attorney, Agent, or Firm*—Alston & Bird LLP

(57) ABSTRACT

Provided are a film formation composition which can produce a film having high strength and low dielectric constant, a method for manufacturing the same, a method for forming a porous film, a porous film, and a semiconductor device containing the porous film internally. More specifically provided is a film formation composition, comprising a polymer which is obtainable by hydrolysis and condensation of one or more hydrolysable silane compounds in the presence of anionic ion exchange resin, wherein the hydrolysable silane compound is selected from the group consisting of Formulae (1) and (2):

$$(R^1)_a Si(R^2)_{4-a} \tag{1}$$

$$(R^3)_b (R^5)_{3-b} Si-R^7-Si(R^6)_{3-c}(R^4)_c \tag{2}$$

wherein $R^1$, $R^3$ and $R^4$ each independently represents a monovalent hydrocarbon group which may have a substituent; $R^2$, $R^5$ and $R^6$ each independently represents a hydrolyzable group; $R^7$ represents a divalent organic group; a represents an integer of 0 to 3; and b and c each represents an integer of 1 or 2.

7 Claims, 1 Drawing Sheet

FOREIGN PATENT DOCUMENTS

| | | |
|---|---|---|
| JP | 2000-309753 | 11/2000 |
| JP | 2000-345041 | 12/2000 |
| JP | 2001-002993 | 1/2001 |
| JP | 2001-049178 | 2/2001 |
| JP | 2001-049179 | 2/2001 |
| JP | 2001-055554 | 2/2001 |
| JP | 2001-080915 | 3/2001 |
| JP | 2001-98218 | 4/2001 |
| JP | 2001-115021 | 4/2001 |
| JP | 2001-115028 | 4/2001 |
| JP | 2001-115029 | 4/2001 |
| JP | 2001-130911 | 5/2001 |
| JP | 2001-131479 | 5/2001 |
| JP | 2001-157815 | 6/2001 |
| JP | 2001-164186 | 6/2001 |
| JP | 2001-203197 | 7/2001 |
| JP | 2001-240798 | 9/2001 |
| JP | 2001-354904 | 12/2001 |
| JP | 2002-020688 | 1/2002 |
| JP | 2002-020689 A | 1/2002 |
| JP | 2002-023354 | 1/2002 |
| JP | 2002-030249 A | 1/2002 |
| JP | 2002-038090 A | 2/2002 |
| WO | WO 00/12640 | 3/2000 |
| WO | WO 02/22710 A1 | 3/2002 |
| WO | WO 02/40571 * | 5/2002 |
| WO | WO 02/40571 A1 | 5/2002 |
| WO | WO 03/052003 A1 | 6/2003 |
| WO | WO 03/088344 | 10/2003 |

OTHER PUBLICATIONS

Inagaki et al., "Synthesis Of Highly Ordered Mesoporous Materials From A Layered Polysilicate", *J. Chem. Soc. Chem. Commun.*, 1993, pp. 680-682.

Supplementary European Search Report for corresponding European Patent Application No. 03 81 1129 dated Dec. 8, 2005.

\* cited by examiner

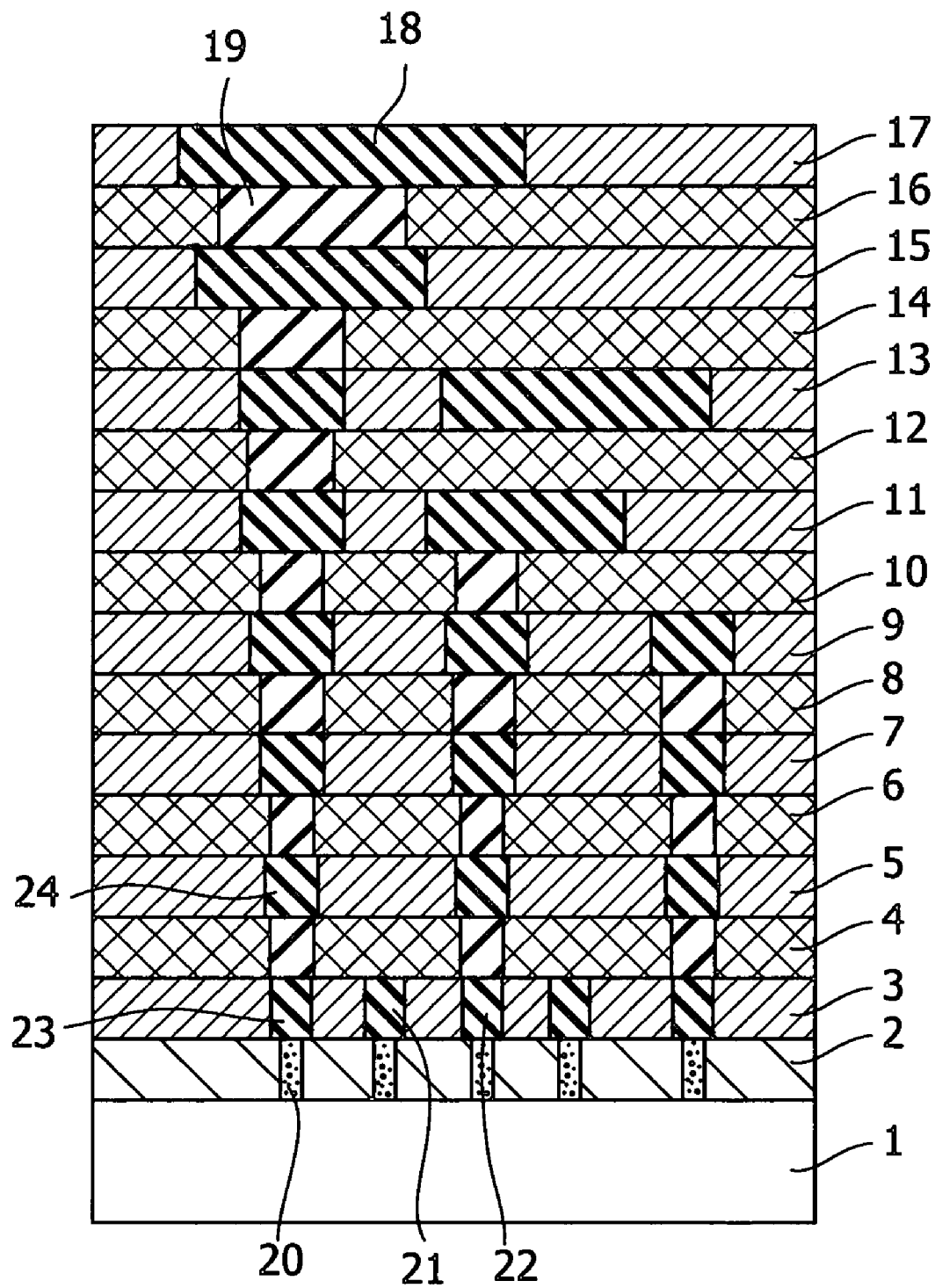

COMPOSITION FOR FORMING POROUS FILM, POROUS FILM AND METHOD FOR FORMING THE SAME, INTERLEVEL INSULATOR FILM, AND SEMICONDUCTOR DEVICE

CROSS-REFERENCE TO RELATED APPLICATION

The present application claims priority to Japanese Patent Application No. 2003-104772, filed Apr. 9, 2003, the disclosure of which is incorporated herein by reference in its entirely.

BACKGROUND OF THE INVENTION

1. Field of the Invention

The present invention relates to a composition for film formation, which can form a porous film which excels in dielectric properties, adhesion, film uniformity and mechanical strength and has reduced moisture absorption; a porous film and a method for forming the same; and a semiconductor device which contains the porous film inside.

2. Description of the Related Art

In the fabrication of semiconductor integrated circuits, as the circuits are packed tighter, an increase in interconnection capacitance, which is a parasitic capacitance between metal interconnections, leads to an increase in interconnection delay time, thereby hindering the enhancement of the performance of semiconductor circuits. The interconnection delay time is called an RC delay, which is in proportion to the product of the electric resistance of the metal interconnections and the static capacitance between the interconnections. Reducing the interconnection delay time requires reducing the resistance of metal interconnections or the interconnection capacitance.

One of the methods for reducing the interconnection capacitance includes lowering the dielectric constant of the interlevel insulator film between the metal interconnection. Then, a porous insulator film has been proposed. Since pores in the film can decrease mechanical strength, however, an insulating film having both a low dielectric constant and high intensity has been demanded.

A first method for forming a porous film is as follows: a precursor solution of a siloxane polymer containing a thermally unstable organic component is synthesized; then the precursor solution is applied on the substrate to form a coating film; and later, a heat treatment is applied to decompose and volatilize the organic component. The result is a number of micro-pores formed in the film.

As one of the methods for forming an insulator film includes a method comprising steps of preparing a siloxane polymer precursor containing a thermally unstable organic component, applying a solution of the precursor to a substrate to yield a film, and heating the film so as to decompose and evaporate the organic component so that the space the organic component has occupied becomes pores. However, there is a problem that a volatile component and decomposed substance remain and cause the electrical property degradation and the interface separation of the insulator film during a semiconductor device production process.

Moreover, a composition comprising low to medium molecular weight siloxane polymer is proposed (Japanese Patent Provisional Publication No. 2001-164186). Herein, a high molecular weight siloxane polymer is produced by hydrolysis and condensation of a silane compound in the presence of alkaline catalyst and is subjected to hydrolysis and condensation the presence of acidic catalyst together with a silane compound so as to form the low to medium molecular weight siloxane polymer. However, dielectric constant of the composition is not sufficiently low. Also proposed is a high molecular weight siloxane polymer which is obtained through hydrolysis and condensation of a silane compound, in the presence of the organic base or inorganic salt radical. However, the film strength of the high molecular weight siloxane polymer is insufficient.

As mentioned above, the conventional materials have problems such as deterioration of film quality during a heat treatment step and higher cost. In addition, enlargement of pore diameters take place during the formation of porous film, making it difficult to obtain the low dielectric constant. Further, when the conventional porous film is incorporated into the multi-level interconnects of the semiconductor device as an insulator film, the mechanical strength necessary for the semiconductor device is not obtained.

Thus, when the dielectric constant of the porous film used as an insulator film in the multi-level interconnects of the semiconductor device is too high, the RC delay in the multi-level interconnects of the semiconductor device is increased. Consequently, the performance of the semiconductor device (high speed and low power consumption) has not been improved. Furthermore, a porous film having a low mechanical strength lowers the reliability of the semiconductor device.

SUMMARY OF THE INVENTION

The object of the invention is to provide a composition for film formation, a method for preparing the same, a porous film and a method for forming the same. It is also to provide a high-performing and highly reliable semiconductor device which contains the porous film inside.

The inventors have found the followings. In the case of the insulator film produced by the composition comprising a main component of siloxane polymer having narrow molecular weight distribution without porogen, when the molecular weight of the siloxane polymer is large, the dielectric constant decreases although film strength is low. When the molecular weight of the insulator film is small, the dielectric constant increases although film strength increases. The high molecular weight siloxane polymer is prevented from molecular aggregation during solvent volatilization because of steric hindrance so that intermolecular pores are easily generated. Since the siloxane polymer is low in the content of the cross-linking reactive group, however, the film strength is lowered. On the other hand, when the molecular weight of the siloxane polymer is small, the polymer aggregates tightly during the solvent evaporation and is high in the content of the cross-linking reactive group. Accordingly, the film strength is increased.

The inventors have found that the composition comprising polymer produced by hydrolysis and condensation of the hydrolysable silane compound in the presence of anionic ion exchange resin forms a film having a low dielectric constant and high strength. More specifically, the inventors have found that the composition for film formation comprising polymer produced by hydrolysis and condensation, in the presence of anionic ion exchange resin, of one or more hydrolysable silane compounds selected from the group consisting of compounds represented by Formulae (1) and (2), forms a uniform and plane porous film having dielectric constant of 2.2 or less as well as modulus of 5 Gpa or more. The compounds represented by Formulae (1) and (2) are as follws:

(1)

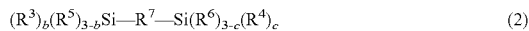

(2)

wherein $R^1$, $R^3$ and $R^4$ each independently represents a monovalent hydrocarbon group which may have a substituent; $R^2$, $R^5$ and $R^6$ each independently represents a hydrolyzable group; $R^7$ represents a divalent organic group; a represents an integer of 0 to 3; and b and c each represents an integer of 1 or 2.

Thus, the invention provides a composition for film formation comprising polymer obtainable by hydrolysis and condensation of a hydrolysable silane compound in the presence of anionic ion exchange resin; a method for preparing a film formation composition comprising polymer obtainable by hydrolysis and condensation of a hydrolysable silane compound in the presence of anionic ion exchange resin; method for forming a porous film comprising steps of applying the composition to a substrate, drying, and heating a formed film at temperature equal to or higher than curing temperature; and the porous film obtainable by the method.

The semiconductor device of the invention comprises a porous film internally which is formable by a film formation composition comprising a polymer which is obtainable by hydrolysis and condensation of one or more hydrolysable silane compounds in the presence of anionic ion exchange resin, wherein the hydrolysable silane compound is selected from the group consisting of Formulae (1) and (2):

(1)

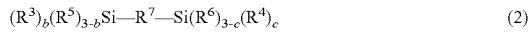

(2)

wherein $R^1$, $R^3$ and $R^4$ each independently represents a monovalent hydrocarbon group which may have a substituent; $R^2$, $R^5$ and $R^6$ each independently represents a hydrolyzable group; $R^7$ represents a divalent organic group; a represents an integer of 0 to 3; and b and c each represents an integer of 1 or 2.

More specifically, the porous film is used as the interlevel insulating film for the multi-level interconnections of the semiconductor device.

According to the invention, the moisture absorption of the porous film is lowered while the mechanical strength thereof maintaines. Hence, the semiconductor device containing the insulator film having low dielectric constant inside is provided. Since the insulator film has lower dielectric constant, the parasitic capacitance around the multi-level interconnects is reduced, thereby achieving high-speed and low-power operations of the semiconductor device.

Moreover, it is preferable in the semiconductor device that said porous film is between metal interconnections in a same layer of multi-level interconnects, or is between upper and lower metal interconnection layers.

The composition of the invention can produce a film which is plane and uniform and has high mechanical strength, while having a low dielectric constant. The film can be most suitable insulator film for the semiconductor device. When the porous film obtainable by the composition of the invention is used as the insulator film of the multi-level interconnects, a high-performing and highly reliable semiconductor device can be attained.

BRIEF DESCRIPTION OF THE DRAWING

FIG. 1 is a schematic cross-sectional view of a semiconductor device of the invention.

DETAILED DESCRIPTION OF THE PREFERRED EMBODIMENTS

Hereafter, this invention is explained in detail.

In the hydrolysable silane compound of the Formula (1), $R^1$ is a monovalent hydrocarbon group which may have a substituent, and preferably has 1 to 12 carbons. The $R^1$ can include an alkyl group, aryl group, aralkyl group, alkenyl group, epoxy-containing group, amino-containing group and a group whose hydrogen atom or atoms are partially or totally substituted by a halogen atom or atoms. The $R^1$ preferably has 1 to 6 carbons, including methyl, ethyl, propyl and phenyl groups.

In the Formula (1), $R^2$ represents monovalent hydrolysable group, which can include a halogen atoms alkoxy group, acyloxy group, oxime group and amino group. It may be preferably alkoxy group having 1 to 6 carbon atoms because of the easiness of controlling hydrolysis and condensation reactions. Such alkoxy group can include a methoxy group, ethoxy group, propoxy group, isopropoxy group, butoxy group and isobutoxy group.

The hydrolysable silane compound expressed by the Formula (1) may include, but is not limited to, trichlorosilane, trimethoxysilane, triethoxysilane, tripropoxysilane, methyltrichlorosilane, methyltrimethoxysilane, methyltriethoxysilane, methyltripropoxysilane, ethyltrichlorosilane, ethyltrimethoxysilane, ethyltriethoxysilane, propyltrichlorosilane, propyltrimethoxysilane, phenyltrichlorosilane, phenyltrimethoxysilane and phenyltriethoxysilane.

In the hydrolysable silane compound in Formula (2), $R^3$ and $R^4$ each represents monovalent hydrocarbon group which may have a substituent, and preferably represents a straight-chain (linear) or branched alkyl group having 1 to 12 carbons or an aryl group which each group may have a substituent. The examples of $R^3$ and $R^4$ may include those as described for $R^1$.

In the hydrolysable silane compound in Formula (2), $R^5$ and $R^6$ each represents a monovalent hydrolysable group which may include a halogen atom, alkoxy group, acyloxy group, oxime group and amino group. The examples of $R^5$ and $R^6$ may include those as described for $R^2$.

In the hydrolysable silane compound in Formula (2), $R^7$ represents a divalent organic group which may include a straight-chain, branched or cyclic divalent aliphatic hydrocarbon radical having 1 to 6 carbons which may saturated or unsaturated; and a divalent aromatic hydrocarbon radical having 6 to 12 carbons such as a monocyclic ring, a polycyclic condensed ring, a bridged ring and a multi-ring type.

The hydrolysable silane compound may include bis(trimethoxysilyl)methane, bis(triethoxysilyl)methane, bis(methyldimethoxysilyl)methane, bis(methyldiethoxysilyl)methane, bis(dimethoxysilyl)methane, bis(diethoxysilyl)methane, bis(dimethylsilyl)methane, bis(dimethylmethoxysilyl)methane, bis(dimethylethoxysilyl)methane, bis-1,2-(trimethoxysilyl)ethane, bis-1,2-(triethoxysilyl)ethane, bis-1,2-(methyldimethoxysilyl)ethane, bis-1,2-(methyldiethoxysilyl)ethane, bis-1,2-(methylmethoxysilyl)ethane, bis-1,2-(methylethoxysilyl)ethane, bis-1,2-(dimethoxysilyl)ethane, bis-1,2-(diethoxysilyl)ethane, bis-1,2-(dimethylsilyl)ethane, bis-1,2-(dimethylmethoxysilyl)ethane, bis-1,2-(dimethylethoxysilyl)ethane, bis-1,6-(trimethoxysilyl)hexane, bis-1,6-(triethoxysilyl)hexane, bis-1,6-(methyldimethoxysilyl)hexane, bis-1,6-(methyldiethoxysilyl)hexane, bis-1,6-(methylmethoxysilyl)hexane, bis-1,6-(methylethoxysilyl)hexane, bis-1,6-

(dimethoxysilyl)hexane, bis-1,6-(diethoxysilyl)hexane, bis-1,6-(dimethylsilyl)hexane, bis-1,6-(dimethylmethoxysilyl)hexane, bis-1,6-(dimethylethoxysilyl)hexane, bis-1,4-(trimethoxysilyl)benzene, bis-1,4-(triethoxysilyl)benzene, bis-1,4-(methyldimethoxysilyl)benzene, bis-1,4-(methyldiethoxysilyl)benzene, bis-1,4-(methylmethoxysilyl)benzene, bis-1,4-(methylethoxysilyl)benzene, bis-1,4-(dimethoxysilyl)benzene, bis-1,4-(diethoxysilyl)benzene, bis-1,4-(dimethylsilyl)benzene, bis-1,4-(dimethylmethoxysilyl)benzene, and bis-1,4-(dimethylethoxysilyl)benzene.

The polymer, produced by the hydrolysis and condensation of the hydrolysable silane compound in the presence of anionic ion exchange resin, has a wide molecular weight distribution and contains high molecular weight polymer. Thus, it is preferable in view of achieving both high film strength and a low dielectric constant. More specifically, the ratio of weight-average molecular weight to number-average molecular weight may be preferably 5 or more, more preferably 5 to 100. The weight-average molecular weight of the polymer may be preferably 10,000 or more, more preferably 10,000 to 100,000,000. The number-average molecular weight and weight-average molecular weight be obtained using gas permeation chromatography (GPC) based on polystyrene.

The anionic ion exchange resin to be used for the hydrolysis can be commercial available and include strong base anion exchange resin such as polystyrene having a tetraalkylammonium group and weak base anion exchange resin such as polystyrene having a dialkylamino or trialkylamino group. Regarding a preferable amount of the anionic ion exchange resin, an ion exchange amount per unit volume of the anionic exchange resin may be 0.1 mol % or more, more preferably 0.1 to 200 mol % of the hydrolysable silane compound. When it is less than 0.1 mol % of the hydrolysable silane compound, the hydrolysis rate may be too low so that it may not be practical.

The amount of the water used for the hydrolysis may be 0.5 or more and less than 100 mol based on one mol of the hydrolysable group. When it is less than 0.5 mol, the molecular weight of polymer may be low so that a porous film having a low dielectric constant may not be formed. When it is 100 mol or more, it may not be practicable because it becomes troublesome in removing unnecessary water after the hydrolysis.

During the hydrolysis, the organic solvent may be used for keeping the stability of the polymer. The organic solvent may include alcohol having 6 or less carbons, ethyleneoxide-based glycol ether, propyleneoxide-based glycol ether, and dialkyl glycol ether. The organic solvent which is compatible with water is particularly preferable and may include methanol, ethanol, propanol, isopropanol, butanol, isobutanol, propylene glycol monomethyl ether, propylene glycol monoethyl ether and propylene glycol monopropyl ether.

Regarding the method for preparing the composition for film formation, the method for hydrolysis and condensation reactions may not be particularly limited. For example, in a batch system, the anionic ion exchange resin and the hydrolysable silane compound are placed in a reaction vessel for the hydrolysis and condensation, and subsequently the anionic ion exchange resin and the polymer solution are subjected to filter separation. In a continuous system, the hydrolysable silane compound and water are continuously supplied to a reaction tower filled with the anionic ion exchange resin so as to produce a polymer solution. The reaction temperature during the hydrolysis and condensation reactions may not be especially limited if the reaction takes place in a liquid system.

The obtained polymer solution can be used as the composition for film formation without further treatment. However, in the purpose of controlling the film properties, a siloxane polymer whose molecular weight is lower or higher than the weight-average molecular weight of the obtained polymer may be added within 50 wt % of the solid portion of the composition for film formation.

The obtained composition for film formation may be diluted, concentrated or exchanged with the other solvent in accordance with a coating condition, sintering condition and desired film properties. The thickness of the interlevel insulator film suitable to a typical semiconductor device may be obtained using preferably 1 to 30 wt % in solid portion. The solvent for dilution or exchange may include those as described in the solvent for hydrolysis.

Moreover, a surfactant may be added so as to enhance flatness on the surface coated with the composition for film formation.

The composition for film formation to be used for the invention may be thus produced. However, it may not be particularly limited and be produced in any method within the reach of the above teaching.

In the production of film from the composition for film formation, the composition is applied on a substrate to form a film. The substrate which can be coated with the composition may include a semiconductor, glass, ceramic and metal. Any coating method which is available in the field for manufacturing a semiconductor device can be used. The examples may include spin coating, dipping and roller blade. The thickness of the formed film may be usually 0.1 to 2 μm for the interlayer insulating film. Then, the formed film is heated in the step called "pre-bake" so that coated film is immobilized due to the evaporation of the solvent in the coating liquid. The heating temperature may be high enough to evaporate the solvent in the coating liquid.

The film thus formed is heated to the temperature high enough to cure (harden) the polymer and thereby the cured film having pores is obtained.

It is preferable to heat the film at 200 to 500° C. Consequently, the film becomes porous. The heating time may be 1 minute to 2 hours, more preferably 5 minutes to 1 hour. When the heating temperature is too low, the film having low mechanical strength may be formed because of insufficient cure. When the heating temperature is too high, it may not suit the process for manufacturing a semiconductor device. Accordingly, the heating temperature may be more preferably 300 to 450° C.

As for the heating atmosphere, air atmosphere and inert gas atmosphere may produce differences in the distribution of film pores and in the mechanical strength. Then, selection of heating atmosphere can control film properties so that any atmosphere may be used accordingly.

According to the method of film formation of the invention, when the composition for forming a porous film is heated (or reacted) under reduced pressure, a film having a lower dielectric constant can be obtained by eliminating oxygen influence.

The film produced by heating the composition of the invention in accordance with the method of the invention commonly has micro-pores of 10 nm or less and a porosity of 5 to 70%. Moreover, the dielectric constant of the film is usually 2.4 to 1.7. Therefore, the film of the invention is suitable as an insulator film, and especially appropriate for the interlevel insulator film of a high integration circuit.

The porous film of the present invention is particularly preferable as the interlevel insulator film of the interconnections in a semiconductor integrated circuit. The semiconductor device is required to reduce interconnection capacitance in order to prevent interconnection delay when highly integrated. Various means have been developed to achieve this, and one of them is to reduce the relative permittivity of the interlevel insulator film disposed between metal interconnections.

When an interlevel insulator film is prepared by using the composition for forming a porous film of the present invention, the semiconductor device can be downsized and faster and consume less power.

There is a problem that when a porous film is prepared by introducing pores in the film so as to lower the dielectric constant, the mechanical strength of the film decreases as the density of the material composing the film decreases. The decrease in mechanical strength not only affects the strength of the semiconductor device itself but also causes exfoliation due to insufficient strength in a chemical mechanical polishing process, which is generally used in the fabrication process. Particularly, when used as the interlevel insulator film of a semiconductor, the porous film of the invention having high mechanical strength despite the porosity prevents such exfoliation, thereby greatly improving reliability of the produced semiconductor device.

The embodiments of the semiconductor device of the present invention will be described below. FIG. 1 shows a schematic cross-sectional view of an example of the semiconductor device of the invention.

In FIG. 1, the substrate 1 is a Si semiconductor substrate such as a Si substrate or a SOI (Si-on-insulator) substrate; however, it can be a compound semiconductor substrate such as SiGe or GaAs. The interlevel insulator films include the interlevel insulator film 2 of the contact layer; the interlevel insulator films 3, 5, 7, 9, 11, 13, 15, and 17 of the interconnection layers; and the interlevel insulator films 4, 6, 8, 10, 12, 14, and 16 of the via layers. The interconnection layers corresponding to the lowermost interlevel insulator film 3 through the uppermost insulator film 17 are abbreviated as M1, M2, M3, M4, M5, M6, M7 and M8, respectively. The via layers corresponding to the lowermost interlevel insulator film 4 through the uppermost insulator film 16 are abbreviated as V1, V2, V3, V4, V5, V6 and V7, respectively. Although some of the metal interconnections are referred to with the numbers 18 and 21 to 24, the other regions with the same pattern not labeled with numbers indicate metal interconnections. The via plug 19 is made from a metal. In the case of copper interconnection, copper is generally used. The regions having the same pattern as the via plug 19 represent via plugs although they are not labeled with numbers in the drawing. The contact plug 20 is connected to the gate of the transistor (not illustrated) formed on the top surface of the substrate 1 or to the substrate. Thus, the interconnection layers and the via layers are alternately stacked, and multilayer interconnections generally indicate M1 and regions higher than M1. In general, M1 to M3 are called local interconnections, M4 and M5 are called intermediate interconnections or semi-global interconnections, and M6 to M8 are called global interconnections.

In the semiconductor device of the present invention, the porous film of the present invention is used as one or more of the interlevel insulator films 3, 5, 7, 9, 11, 13, 15, and 17 of the interconnection layers or the insulator films 4, 6, 8, 10, 12, 14, and 16 of the via layers.

For example, when the porous film of the present invention is used for the interlevel insulator film 3 of the interconnection layer (M1), the interconnection capacitance between the metal interconnection 21 and the metal interconnection 22 can be greatly reduced. When the porous film of the present invention is used for the interlevel insulator film 4 of the via layer (V1), the interconnection capacitance between the metal interconnection 23 and the metal interconnection 24 can be greatly reduced. Using the porous film with a low relative permittivity of the present invention as an interconnection layer can greatly reduce the metal interconnection capacitance in the same layer. On the other hand, using the porous film with a low relative permittivity of the present invention as a via layer can greatly reduce the capacitance between the upper and lower metal interconnection layers.

Therefore, using the porous film of the present invention for all of the interconnection layers and the via layers can greatly reduce the parasitic capacitance of the interconnections. Hence, the use of the porous film of the present invention as insulator films of the interconnections prevents a conventional problem, that is, an increase in the dielectric constant resulting from the porous film absorbing humidity while multilayered interconnections are formed by stacking porous films. As a result, the semiconductor device can perform high-speed and low-power operations. The porous film of the present invention enables a semiconductor device to have higher mechanical strength by its high mechanical strength, thereby greatly improving the yield of the fabrication and the reliability of the semiconductor device.

The invention will be described specifically through the following examples, but is not restricted to them.

PREPARATION EXAMPLE 1

The 640 g of water, 1200 g of ethanol and 65.9 ml of anion exchange resin (total ion exchange capacity=2.5 meq/ml) were placed in a 5 liter flask. The 30 g of methyltrimethoxysilane (0.22 mol) and 40 g of tetramethoxysilane (0.26 mol) were added thereto dropwise at 25° C. in a period of 5 minutes. Then, the mixture was stirred for 3 hours at 80° C. Next, 400 g of propylene glycol monopropyl ether was added thereto. Then, the methanol and water were evaporated from the resulting mixture at 40° C. under pressure of 20 mmHg. Consequently, 420 g of polymer solution containing 6.9 wt % of solid portion was obtained.

PREPARATION EXAMPLE 2

The 640 g of water, 1200 g of ethanol and 10 g of an aqueous 28% ammonia solution were placed in a 5 liter flask. The 30 g of methyltrimethoxysilane (0.22 mol) and 40 g of tetramethoxysilane (0.26 mol) were added dropwise thereto at 25° C. in the period of 5 minutes. Then, the mixture was stirred at 80° C. for 6 hours. Next, 400 g of propylene glycol monopropyl ether was added thereto. The methanol and water were evaporated from the resulting mixture at 40° C. under pressure of 20 mmHg. Consequently, 390 g of polymer solution containing 7.1 wt % of solid portion was obtained.

PREPARATION EXAMPLE 3

The 640 g of water, 1200 g of ethanol and 10 g of aqueous 28% ammonia solution were placed in a 5 liter flask. The 30 g of methyltrimethoxysilane (0.22 mol) and 40 g of tetramethoxysilane (0.26 mol) were added thereto dropwise in the period of 5 minutes. Then, the mixture was stirred for 3 hours at 60° C. Next, 400 g of propylene glycol monopropyl ether was added thereto. The methanol and water were evaporated from the resulting mixture at 40° C. under pressure of 20 mmHg. Consequently, 470 g of polymer solution containing 5.9 wt % of solid portion was obtained.

EXAMPLE 1 AND COMPARATIVE EXAMPLES 1-2

The compositions obtained in Preparation Examples 1-3, were applied on silicon wafer through spin coating and then air-dried. It was then baked at 425° C. for 60 minutes under a nitrogen gas stream. The coating was carried out for 1 minute at 1,000-3,000 rpm. The modulus and hardness of the film prepared were measured by Nanoindentar XP by MTS Company, and the dielectric constant was measured with an automatic mercury probe made by Japan SSM Company. The weight-average molecular weight and number-average molecular weight of the polymers obtained in Preparation Example 1-3 were obtained using the GPC based on polystyrene conversion. The result is shown in Table 1.

TABLE 1

| | | evaluation results of the film | | | | |
|---|---|---|---|---|---|---|
| | coating liquid | weight-average molecular weight (Mw) | number-average molecular weight (Mn) | Mw/Mn | dielectric constant | modulus (GPa) | hardness (GPa) |
| Example 1 | Prep. Ex. 1 | 14,000 | 1,400 | 10 | 2.19 | 5.0 | 0.54 |
| Comp. Ex. 1 | Prep. Ex. 2 | 465,000 | 94,000 | 4.9 | 2.17 | 1.15 | 0.13 |
| Comp. Ex. 2 | Prep. Ex. 3 | 136,000 | 19,000 | 7.2 | 3.53 | 6.96 | 0.61 |

The invention claimed is:

1. A method for preparing a polymer composition for film formation comprising a step of hydrolysis and condensation of two or more hydrolysable silane compounds in the presence of an anionic ion exchange resin wherein the hydrolysable silane compounds are selected from the group consisting of Formulae (1) and (2):

$(R^1)_a Si(R^2)_{4-a}$     (1)

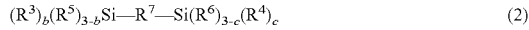

$(R^3)_b(R^5)_{3-b} Si\text{---}R^7\text{---}Si(R^6)_{3-c}(R^4)_c$     (2)

wherein $R^1$, $R^3$ and $R^4$ each independently represents a monovalent hydrocarbon group which may have a substituent; $R^2$, $R^5$ and $R^6$ each independently represents a hydrolyzable group; $R^7$ represents a straight-chain, branched or cyclic divalent aliphatic hydrocarbon radical having 1 to 6 carbon atoms which may be saturated or unsaturated, or a divalent aromatic hydrocarbon radical having 6 to 12 carbons; "a" represents an integer of 0 to 3; and "b" and "c" each represents an integer of 1 or 2; and wherein at least one of the hydrolysable silane compounds is selected from Formula (2), and wherein when $R^7$ is a two carbon straight-chain, branched or cyclic divalent aliphatic hydrocarbon radical, "b" and "c" each represent an integer of 2.

2. The method for preparing a polymer composition for film formation according to claim 1, wherein the polymer has a weight-average molecular weight of 10,000 or more and a ratio of the weight-average molecular weight to a number-average molecular weight is five or more.

3. A method for producing a porous film, comprising the steps of:

preparing a polymer composition for film formation comprising a step of hydrolysis and condensation of two or more hydrolysable silane compounds in the presence of an anionic ion exchange resin wherein the hydrolysable silane compounds are selected from the group consisting of Formulae (1) and (2):

$(R^1)_a Si(R^2)_{4-a}$     (1)

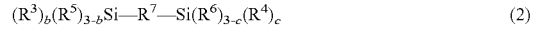

$(R^3)_b(R^5)_{3-b} Si\text{---}R^7\text{---}Si(R^6)_{3-c}(R^4)_c$     (2)

wherein $R^1$, $R^3$ and $R^4$ each independently represents a monovalent hydrocarbon group which may have a substituent; $R^2$, $R^5$ and $R^6$ each independently represents a hydrolyzable group; $R^7$ represents a straight-chain, branched or cyclic divalent aliphatic hydrocarbon radical having 1 to 6 carbon atoms which may be saturated or unsaturated, or a divalent aromatic hydrocarbon radical having 6 to 12 carbons; "a" represents an integer of 0 to 3; and "b" and "c" each represents an integer of 1 or 2; and wherein at least one of the hydrolysable silane compounds is selected from Formula (2), and wherein when $R^7$ is a two carbon straight-chain, branched or cyclic divalent aliphatic hydrocarbon radical, "b" and "c" each represent an integer of 2;

applying the polymer composition to a substrate to form a film thereon, drying the film, and heating the film at a temperature between 200° and 500° C. to form a porous film.

4. The method according to claim 3, wherein the polymer composition has a weight-average weight of 10,000 or more and a ratio of the weight-average molecular weight to a number-average molecular weight is five or more.

5. A method for producing a porous film, comprising the steps of:

preparing a polymer composition for film formation comprising a step of hydrolysis and condensation of a hydrolysable silane compound in the presence of an anionic exchange resin wherein the hydrolysable silane compound is selected from the group having the following formula:

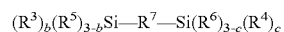

$(R^3)_b(R^5)_{3-b} Si\text{---}R^7\text{---}Si(R^6)_{3-c}(R^4)_c$ wherein $R^3$ and $R^4$ each independently represents a monovalent hydrocarbon group which may have a substituent; $R^5$ and $R^6$ each independently represents a hydrolysable group; $R^7$ represents a straight-chain, branched or cyclic divalent aliphatic hydrocarbon radical having 1 to 6 carbon atoms which may be saturated or unsaturated, or a divalent aromatic hydrocarbon radical having 6 to 12 carbons; "a" represents an integer of 0 to 3; and "b" and "c" each represents an integer of 1 or 2, and wherein when $R^7$ is a two carbon straight-chain, branched or cyclic divalent aliphatic hydrocarbon radical, "b" and "c" each represent an integer of 2;

applying the polymer composition to a substrate to form a film thereon, drying the film, and heating the film at a temperature between 200° and 500° C. to form a porous film.

6. A method for preparing a polymer composition for film formation comprising a step of hydrolysis and condensation of a hydrolysable silane compound in the presence of an anionic exchange resin wherein the hydrolysable silane compound is selected from the group having the following formula:

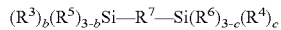

wherein $R^3$ and $R^4$ each independently represents a monovalent hydrocarbon group which may have a substituent; $R^5$ and $R^6$ each independently represents a hydrolysable group; $R^7$ represents a straight-chain, branched or cyclic divalent aliphatic hydrocarbon radical having 1 to 6 carbon atoms which may be saturated or unsaturated, or a divalent aromatic hydrocarbon radical having 6 to 12 carbons; "a" represents an integer of 0 to 3; and "b" and "c" each represents an integer of 1 or 2, and wherein when $R^7$ is a two carbon straight-chain, branched or cyclic divalent aliphatic hydrocarbon radical, "b" and "c" each represent an integer of 2.

7. The method according to claim 6, wherein the polymer composition has a weight-average weight of 10,000 or more and a ratio of the weight-average molecular weight to a number-average molecular weight is five or more.

* * * * *